US007838208B2

(12) United States Patent
Yellen et al.

(10) Patent No.: US 7,838,208 B2
(45) Date of Patent: Nov. 23, 2010

(54) PROGRAMMABLE SELF-ALIGNING LIQUID MAGNETIC NANOPARTICLE MASKS AND METHODS FOR THEIR USE

(75) Inventors: Benjamin B. Yellen, Cary, NC (US); Gennady Friedman, Richboro, PA (US)

(73) Assignee: Drexel University, Philadelphia, PA (US)

( * ) Notice: Subject to any disclaimer, the term of this patent is extended or adjusted under 35 U.S.C. 154(b) by 909 days.

(21) Appl. No.: 10/585,161

(22) PCT Filed: Dec. 29, 2004

(86) PCT No.: PCT/US2004/043620

§ 371 (c)(1),
(2), (4) Date: Mar. 28, 2007

(87) PCT Pub. No.: WO2005/065303

PCT Pub. Date: Jul. 21, 2005

(65) Prior Publication Data

US 2007/0224517 A1    Sep. 27, 2007

Related U.S. Application Data

(60) Provisional application No. 60/533,274, filed on Dec. 30, 2003.

(51) Int. Cl.
*G03F 1/00*      (2006.01)
*G03C 5/00*      (2006.01)
*A61K 9/14*      (2006.01)

(52) U.S. Cl. .............................. 430/394; 430/5; 424/489

(58) Field of Classification Search ..................... 430/5, 430/322, 394; 428/402; 424/489; 250/492.22
See application file for complete search history.

(56) References Cited

U.S. PATENT DOCUMENTS 6,984,265 B1 *   1/2006   Raguse et al. ................. 117/73
2004/0150865 A1 *  8/2004   Chen et al. ................... 359/252

OTHER PUBLICATIONS

Bruckbauer et al., "Multicomponent Submicron Features of Biomolecules Created by Voltage Controlled Deposition from a Nanopipet", J. Am. Chem. Soc. 2003 125:9834-9839.
Craighead et al., "Chemical and topographical patterning for directed cell attachment", Current Opinion in Solid State and Materials Science 2001 5:177-184.
Fodor et al., "Multiplexed biochemical assays with biological chips", Nature 1993 364:555-556.
Hovorka et al., "Modeling Stability of Trapped Ferromagnetic Nanoparticle Chains", IEEE Transactions on Magnetics 2003 39(5):2549-2551.
Lee et al., "Protein Nanoarrays Generated by Dip-Pen Nanolithography", Science 2002 295:1702-1705.
McGall et al., "The Efficiency of Light-Directed Synthesis of DNA Arrays on Glass Substrates", J. Am. Chem. Soc. 1997 119(22):5081-5090.

(Continued)

*Primary Examiner*—Stephen Rosasco
(74) *Attorney, Agent, or Firm*—Drinker Biddle & Reath LLP

(57) ABSTRACT

Magnetic nanoparticle masks for lithographic applications of a substrate and methods for producing such masks via defining regions of localized magnetic field maxima and minima on a substrate are provided. Also provided are methods for producing multi-component patterns on a substrate with the magnetic nanoparticle masks.

5 Claims, 6 Drawing Sheets

OTHER PUBLICATIONS

Plaks et al., "Generalized Finite-Element Method for Magnetized Nanoparticles", IEEE Transactions on Magnetics 2003 39(3):1436-1439.

Yellen et al., Printing superparamagnetic colloidal particle arrays on patterned magnetic film, J. Applied Physics 2003 93(10):7331-7333.

Yellen et al., "Analysis of interactions for magnetic particles assembling on magnetic templates", J. Applied Physics 2002 91(10):8552-8554.

Yellen et al., "Analysis of repulsive interaction in chains of superparamagnetic colloidal particles for magnetic template-based self-assembly", J. Applied Physics 2003 93(10):8447-8449.

Xia et al., "Microcontact Printing of Octadecylsiloxane on the Surface of Silicon Dioxide and Its Application in Microfabrication", J. Am. Chem. Soc. 1995 117:9576-9577.

Pan et al., "Kinetics of Alkanethiol Adsorption on Gold", Langmuir 1996 12:4469-4473.

* cited by examiner

PROGRAMMABLE SELF-ALIGNING LIQUID MAGNETIC NANOPARTICLE MASKS AND METHODS FOR THEIR USE

INTRODUCTION

This patent application is the National Stage of International Application No. PCT/US2004/043620, filed Dec. 29, 2004, which claims the benefit of priority from U.S. Provisional Patent Application Ser. No. 60/533,274, filed Dec. 30, 2003, each of which are herein incorporated by reference in their entirety.

This invention was supported in part by a grant from the U.S. National Science Foundation (NIRT Award No. 0304453) and the U.S. government may therefore have certain rights in the invention.

FIELD OF THE INVENTION

The present invention relates to magnetic nanoparticle masks and methods for their use. The masking materials are not only compatible with traditional photolithographic processes but can also be used to assist in the fabrication of emerging medical, optical and wireless devices. In this method, a suspension of magnetic nanoparticles such as ferrofluid, which is composed of ultra-fine iron oxide grains, is used to protect and/or deprotect selected areas of a magnetically programmable substrate. Automatic mask formation and registration is controlled by magnetic field gradients produced either remotely or produced by materials contained on the substrate. Application of external magnetic fields to the system causes the magnetic nanoparticles to aggregate only at regions of magnetic field maxima, thereby masking those areas from, for example, ultraviolet radiation, chemical or physical etchants, ion implantation, chemical exposure, or binding of a molecule such as a protein or nucleic acid. This method is particularly useful in the fabrication of patterned substrates used, for example in combinatorial chemistry, drug discovery and genomics, wherein features of the substrate are micron- or submicron-sized. Applications of magnetic particle masks also exist in the fabrication of optically or electrically conductive interconnects for use in arranging electronic and optical systems. Magnetic nanoparticle masks also find use in arranging diverse materials or components onto flexible, curved and/or plastic substrates. These abilities are expected to be useful in the fabrication of biomedical implants and Radio Frequency Identification (RFID) tags.

BACKGROUND OF THE INVENTION

Multi-component surfaces are of enormous importance with applications in electronics, photonics, genome analysis, drug discovery, and cellular systems. Surfaces designed with a precise arrangement of conductive or insulating materials form the basis of modern electronic devices. Chemically heterogeneous surfaces have been fabricated for use in biochemical sensing (Fodor et al. Nature 1993 364:555) and in assembling arrays of living cells (Graighead et al. Curro Opin. Solid State Mat. Sci. 2001 5:177). In general, previous strategies for fabricating such devices have relied on highly planar surfaces formed from brittle crystalline materials, such as silicon or gallium arsenide. These fabrication strategies often employ high temperatures, pressure, chemical solvents and other harsh conditions, which cannot be used on more delicate materials. Today, there is an emerging paradigm of microdevices based on surfaces that are highly curved or flexible, and on materials that are soft or delicate, such as organic molecules and other polymers. There is a need for new patterning strategies that can handle these materials and surfaces. Several groups have attempted to fabricate these surfaces by direct writing methods using converted scanning probe microscopes (Demers et al. Science 2002 295:1701; Cao et al. Science 2002 296:1838; and Bruckbauer et al. JACS 2003 125:9834); however these methods are only useful for patterning small areas. Other techniques have been based on self-assembly (or bottom-up assembly) Self-assembly techniques are massively parallel; however, most traditional self-assembly techniques fall short when it comes to assembling more than one type of component. Accordingly, building multi-component surfaces on a commercial scale at the nanoscale and microscale level has remained a major challenge because of the high precision and parallelism that is simultaneously required to create such surfaces. While significant time and resources have been invested in the area of multi-component nanopatterning, no single technique has been developed to date that is capable of satisfying both requirements of resolution and speed.

Fabrication of heterogeneous substrates of the kind used for combinatorial chemistry, drug discovery and genomics typically requires multiple lithographic steps. For example, heterogeneous substrates have been successfully fabricated by photolithography (McGall et al. JACS 1997 119:5081). However, photolithography is an expensive, chemically intensive, and laborious process typically requiring multiple steps to produce even a single pattern. These steps include optical masking to selectively expose and develop areas of photoresist material, followed by etching or depositing material through the photoresist masking pattern, and finally dissolving the photoresist mask. Creating heterogeneous substrates by photolithography requires repeating the alignment and registration steps for each new pattern in order to ensure proper geometric relation between the patterns on the surface. Manual alignment and registration of many different masks to the substrate becomes increasingly difficult to control when the critical feature size is micron or even sub-micron in resolution or when the number of aligned patterns becomes very large. It is in these cases particularly, where the ability to self-align the masking material onto the surface is expected to be useful.

Programmable assembly of micron-sized colloidal particles, carrying various molecules, such as proteins, DNA fragments or fluorescent labels, into precise geometric patterns has been demonstrated using magnetic forces and magnetically encoded surfaces (Yellen et al. J. Appl. Phys. 2003 93:7331). Previous work has shown that the number of particles deposited (or not deposited) at each surface site can be reliably controlled through a combination of magnetic and morphological template features. Regular heterogeneous colloidal patterns were assembled by this technique using only physical forces (i.e. magnetic, hydrodynamic and surface forces). The theoretical process of particle assembly onto magnetic surfaces has also been analyzed in order to guide experimental investigations (Yellen et al. 2002 J. Appl. Phys. 912:855; Yellen et al. J. Appl. Phys. 2003 93:8447; Plaks et al. IEEE Trans. Mag. 2003 39:1436; and Hovorka et al. IEEE Trans Mag. 2003 39:2549).

In the present invention, a method is provided for depositing magnetic nanoparticles at programmed locations on a substrate surface in order to mask selected sites rather than to deliver molecules using magnetic particles as the carriers. In this method, the magnetic nanoparticles are programmed to accumulate at selected sites on the substrate in order to mask these selected sites from, for example ultraviolet radiation and/or chemically reactive molecules or binding of a molecule such as a protein or a nucleic acid.

SUMMARY OF THE INVENTION

An object of the present invention is to provide materials and methods for masking substrates using magnetic nanoparticle masks. The method of the present invention employs local magnetic field gradients, produced either by magnets held external to or magnets embedded within a substrate, to form a magnetic nanoparticle mask. Once formed, the mask protects designated regions of the underlying surface from modifying effects of ultraviolet or other forms of radiation, from action of physical or chemical etchants, from attachment of chemically reactive molecules, from deposition of materials by evaporation, sputtering or electrochemical processes, from ion implantation, from diffusion of various small molecules or particles and from any other substrate modifying processes.

Another object of the present invention is to provide a method for fabricating a multi-component pattern on a substrate which comprises producing a first set of regions of localized magnetic field maxima on a surface; applying a suspension of magnetic nanoparticles to the substrate so that the magnetic nanoparticles of the suspension aggregate on top of the first set of regions of localized magnetic field maxima, thereby masking the first set of selected areas; exposing the substrate to a first modifying substance to alter any unmasked sites of the substrate via exposure to the first modifying substance; quenching or removing the first modifying substance, if necessary; defining a second set of regions of localized magnetic field maxima on the substrate; applying magnetic nanoparticles to the substrate so that the magnetic nanoparticles aggregate at the second set of regions of localized magnetic field maxima, thereby masking the second set of selected areas; exposing the substrate to a second modifying substance to alter any unmasked sites of the substrate via exposure to the second modifying substance; and quenching or removing the second modifying agent, if necessary. By repeating this procedure, a series of different masking patterns can be used to build up a heterogeneous multi-component pattern step by step.

BRIEF DESCRIPTION OF THE FIGURES

FIG. 1(a) depicts ferrofluid (black) attracted to the right-side of a ferromagnetic bit (white rectangle with arrow denoting bit magnetization) by external magnetic field bias applied perpendicularly to the bit's magnetization. When the external field bias is reversed, the ferrofluid is repelled from the right-hand pole and attracted to the left-hand pole as illustrated in FIG. 1(b). Ferrofluid will deposit in between the bits when external magnetic fields are applied parallel to the bit's magnetization, as illustrated in FIG. 1(c), and on top of the bit when the applied field is reversed, as illustrated in FIG. 1(d).

FIG. 2(a) depicts a photosensitive film on top of the ferromagnetic alignment marks, and upon application of external magnetic fields as shown in FIG. 1(a), magnetic nanoparticles accumulate on top of the photosensitive film, thereby masking the photosensitive film from ultraviolet exposure. FIG. 2(b) depicts the photosensitive film after exposure and development, leaving behind spots of photosensitive resist where the magnetic nanoparticle mask had accumulated.

FIG. 3(a) depicts a set of bits that are masked by ferrofluid, while the other set of bits are not, thus allowing a solution containing DNA molecules with reactive complexes to chemically bond to the unmasked locations. FIG. 3(b) depicts the array after re-magnetization of the bits and exposure to a new solution containing DNA molecules with reactive complexes which modifies the new set of unmasked locations. FIG. 3(c) depicts the heterogeneous chemical array after the two masking steps.

FIGS. 6(a) and 6(b) are the masking patterns formed by magnetic fields applied to the substrate as shown in FIG. 1(a), while FIGS. 6(d) and 6(e) are the masking patterns formed by magnetic fields applied to the substrate as shown in FIG. 1(d). The negative NR-7 photosensitive film is specifically formulated for lift-off. After formation of the masking pattern in the photoresist film, gold metal was evaporated on top of substrate. Then the photoresist film was stripped, resulting in a gold pattern aligned with respect to the ferromagnetic bits.

DETAILED DESCRIPTION OF THE INVENTION

Figure 1:
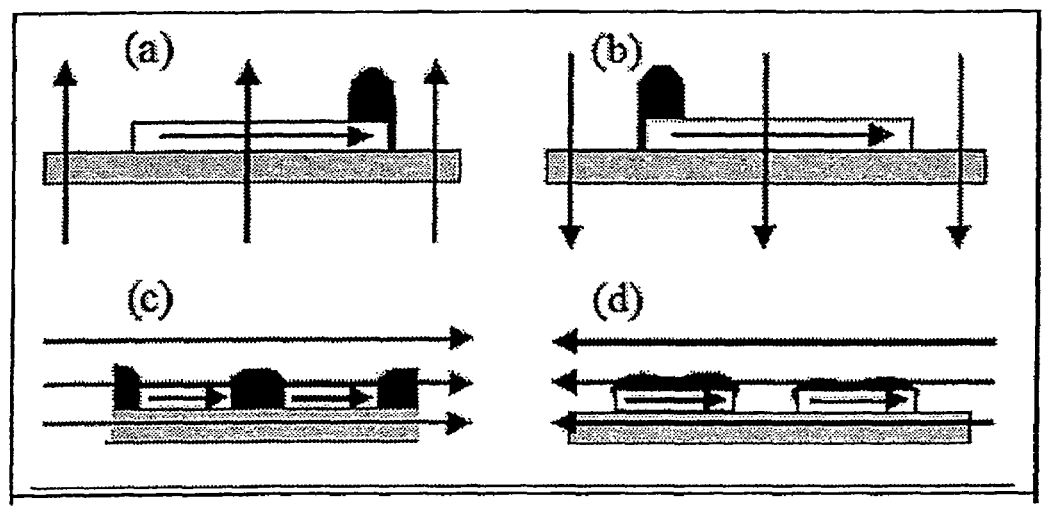
FIGS. 1(a) through 1(d) are diagrams depicting direction of attraction of ferrofluid in relation to the external magnetic field bias.

The present invention provides a soft masking method that employs magnetic nanoparticle materials and the means for arranging the magnetic nanoparticles on a surface using regions of localized magnetic field maxima. External magnets or magnets embedded inside a surface can be used to generate regions of magnetic field maxima, which define and automatically align sequences of magnetic nanoparticle masking patterns. The magnetic nanoparticles can be employed in a gas or liquid phase with a liquid suspension of magnetic particles such as ultra-fine iron oxide grains suspended in fluid (ferrofluid) being preferred. This suspension can be programmed by external magnets to protect and/or de-protect selected areas of a patterned substrate according to a sequence. As shown herein, a suspension of magnetic nanoparticles such as ferrofluid can be used to assemble regular structures on patterned ferromagnetic film or substrates, and controlled photoresist patterns can be produced using the methodology of the present invention. Further, the lithographic application of a suspension of magnetic nanoparticles such as a ferrofluid in the present invention is not limited to optical masking. These masking techniques can also be applied as a diffusion mask during solution-based synthesis. An advantage is that the mask formation and material deposition can be combined into a single step. For example, the accumulation of magnetic nanoparticles on the magnetic pattern can be used to restrict molecules, such as DNA or proteins, from assembling at masked locations. Various techniques for molecular self-assembly, including the gold-thiol (Pan et al. Langmuir 1996 12:4469) and $SiO_2$-siloxane (Xia et al. J. Am. Chem. Soc. 1996 117:9576) interactions, have been employed to create molecular monolayers on a surface. The assembly of molecular monolayers can be prevented by the magnetic nanoparticle accumulation at these locations. The magnetic nanoparticle diffusion masks can also be used to protect chemically active regions of a surface from reaction with a component that is introduced into the suspension. Another benefit is that magnetic nanoparticle masks can be easily dissolved without intensive chemical strippers. This gentle synthesis approach of the present invention is expected to be useful in patterning multiple layers of delicate biological materials such as proteins and cells. However, these masking techniques can also be used to protect and/or de-protect a surface from alterations by other chemical or physical etchants, various forms of radiation, by ion implantation, by neutron beam exposure, or by any substrate modifying process.

In this method, nanometer sized magnetic particles, referred to herein as nanoparticles, are applied to a substrate in suspension and deposited at programmed locations on a surface of ferromagnetic bits. The magnetic nanoparticles can range from single molecules to particles with diameters of hundreds of nanometers, more preferably from 5 to about 20 nanometers. Magnetic nanoparticles may comprise iron oxide, cobalt, nickel, iron, iron platinum, rare earth materials, paramagnetic ions, molecular magnets, and any superparamagnetic or weakly ferromagnetic material that is suspended in gas or in various solvents, such as water, alcohol, or organic based-solvents. An exemplary suspension of magnetic nanoparticles useful in the present invention is a ferrofluid which comprises a liquid suspension of ultra fine iron oxide particles. Magnetic nanoparticle suspensions such as ferrofluid provide a desirable alternative to micron-sized and sub-micron sized polymerized beads loaded with magnetic grains (such as those produced by Dynal Biotech or Spherotech) because the diffusion coefficient of sub 20-nm particles is large. Also, magnetic nanoparticle solutions such as ferrofluid do not settle out in solution as micron-sized particles are prone to do. Since the masking resolution is ultimately limited by the magnetic nanoparticle size, smaller magnetic nanoparticles are usually preferred.

In contrast to prior art methods such as taught in WO 01/51668 wherein the goal is to deliver molecules to a particular site, the goal in the present invention is to mask particular locations of the surface from exposure to ultraviolet radiation, chemically reactive molecules, binding of a molecule such as a protein or nucleic acid, chemical or physical etchants, ion implantation, or neutron or electron beam exposure. The magnetic nanoparticle mask is self-formed by application of external magnets held near or embedded directly inside the substrate. External magnetic pins, for example, can be held directly underneath the substrate. These pins create strong local magnetic field maxima for attracting the magnetic nanoparticles. Magnetic film can also be embedded inside or patterned directly on top of the substrate. For this application, a ferromagnetic film is preferred because it can retain memory and can be remotely programmed by existing magnetic recording methods. Thus, the masking technique allows for self-aligned programmable mask formation by recoding specific states in the magnetic film elements.

A diagram of the general process of field-assisted magnetic nanoparticle suspension assembly onto a recordable magnetically patterned substrate in accordance with the present invention is shown in FIG. 1(a) through 1(d). In this process, a recordable magnetically patterned substrate is subjected to a uniform external magnetic field applied perpendicularly to the magnetization of the patterned substrate. The uniform external magnetic field magnetizes the nanoparticles of the suspension and preferentially draws the nanoparticles to one of the poles of the magnetic pattern of the substrate. The nanoparticles can be switched to the opposite pole by simply reversing the external magnetic field bias. Thus, depending on the external field orientation and hence particle magnetization, nanoparticles of the suspension will be preferentially deposited at specific locations with respect to the bits of the recordable magnetic pattern. For example, as shown in FIGS. 1(a) and 1(b), when the external field is applied normal to the plane, nanoparticles accumulate over one or the other pole. Alternatively, as shown in FIGS. 1(c) and 1(d), when the external field is applied in the plane with orientation parallel or anti-parallel to the substrate magnetization, the nanoparticles assemble in between or on top of the substrate. Preferential deposition is used to selectively mask certain locations on the surface from exposure to ultraviolet radiation, physical or chemical etchants, or chemicals or binding of a molecule.

Figure 2:
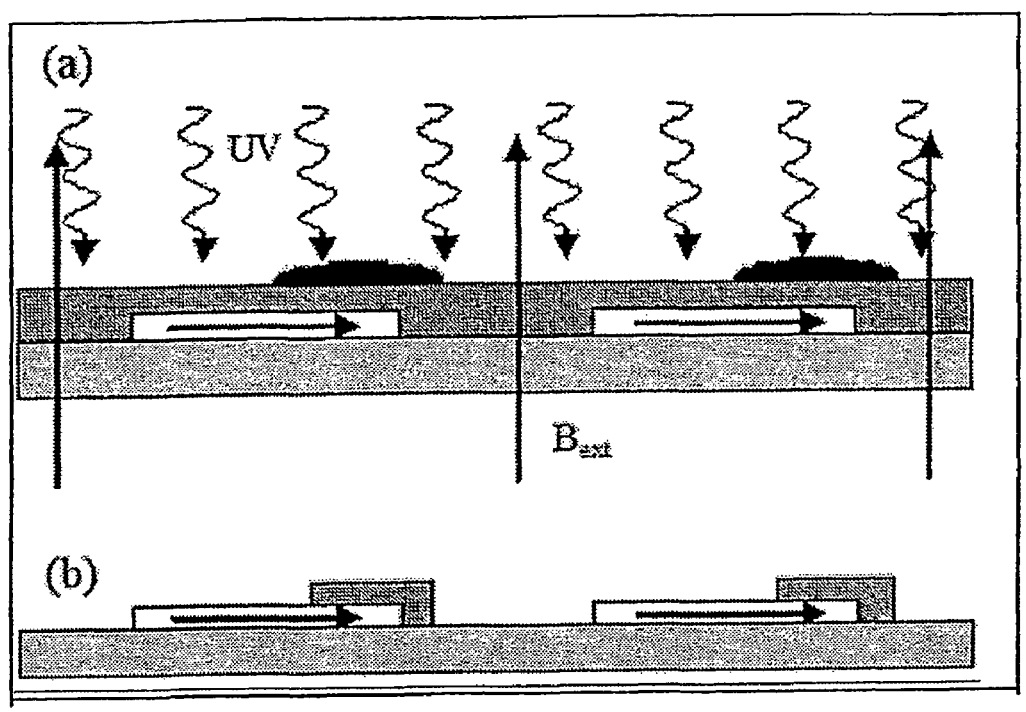
FIGS. 2(a) and 2(b) are diagrams depicting how ferrofluid accumulation can mask areas of photosensitive film.
Figure 3:
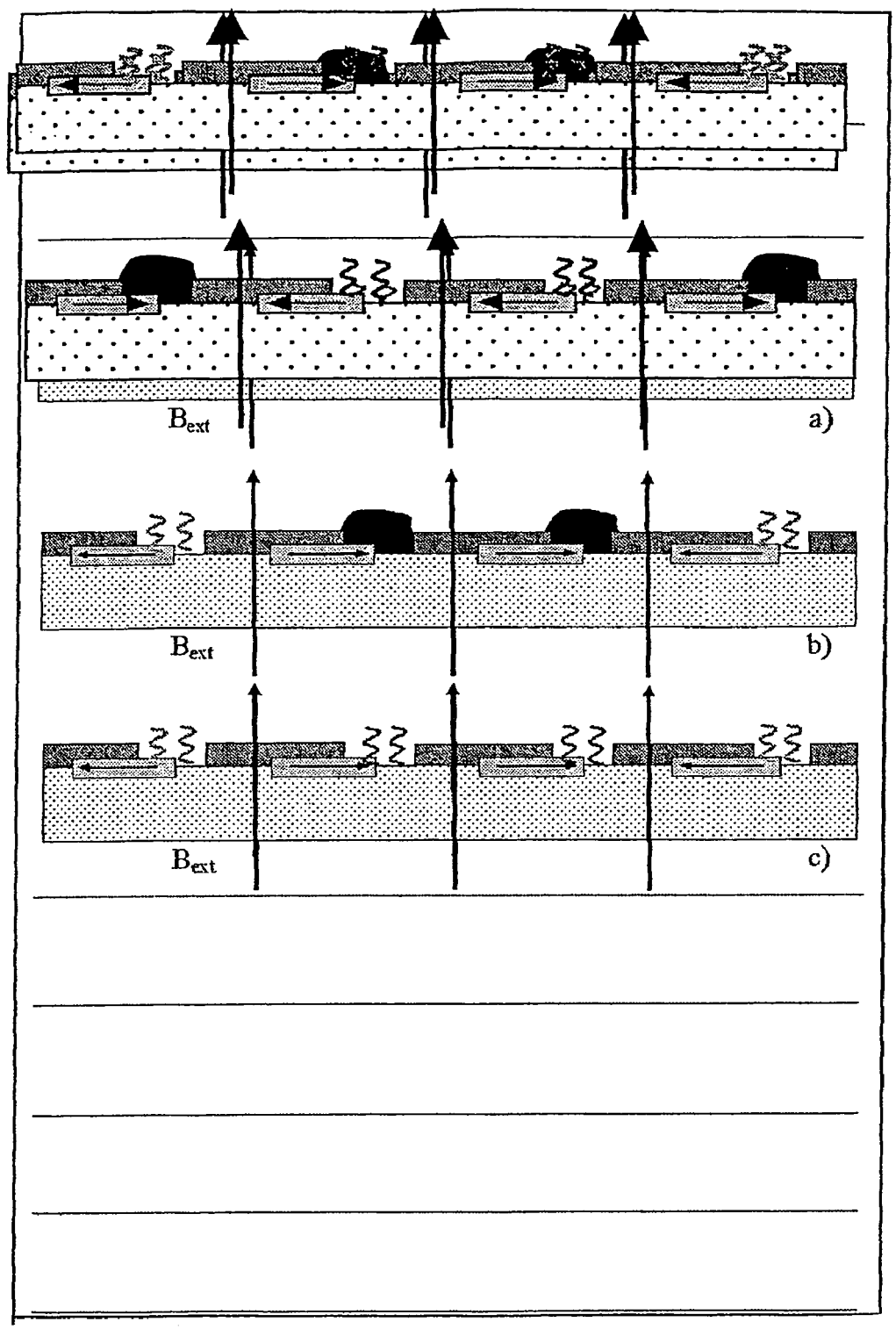
FIGS. 3(a) through 3(c) are diagrams depicting how ferrofluid accumulation can mask areas of a surface from adsorption or reaction with chemically modifying reagents such as DNA fragments.

Diagrams of ferrofluid masking against ultraviolet exposure and chemically reactive molecules are shown in FIGS. 2 and 3. FIGS. 2(a) and 2(b) are diagrams depicting how ferrofluid accumulation can mask areas of photosensitive film. FIG. 2(a) depicts a photosensitive film on top of the ferromagnetic bits, and upon application of external magnetic fields like that shown in FIG. 1 (a), magnetic nanoparticles accumulate on top of the photosensitive film, thereby masking the photosensitive film from ultraviolet exposure. FIG. 2(b) depicts the photosensitive film after exposure and development, leaving behind spots of photosensitive film where the magnetic nanoparticles had accumulated.

FIGS. 3(a) through 3(c) are diagrams depicting how ferrofluid accumulation can mask areas of a surface from adsorption or reaction with chemically modifying reagents such as DNA fragments. FIG. 3(a) depicts a set of magnetic bits that are masked by ferrofluid, while the other set of magnetic bits are not, thus allowing a solution of DNA to modify the unmasked locations. FIG. 3(b) depicts the array after re-magnetization of the bits and exposure to a new solution of DNA which modifies the new set of unmasked locations. FIG. 3(c) depicts the heterogeneous chemical array after the two masking steps.

Figure 4:
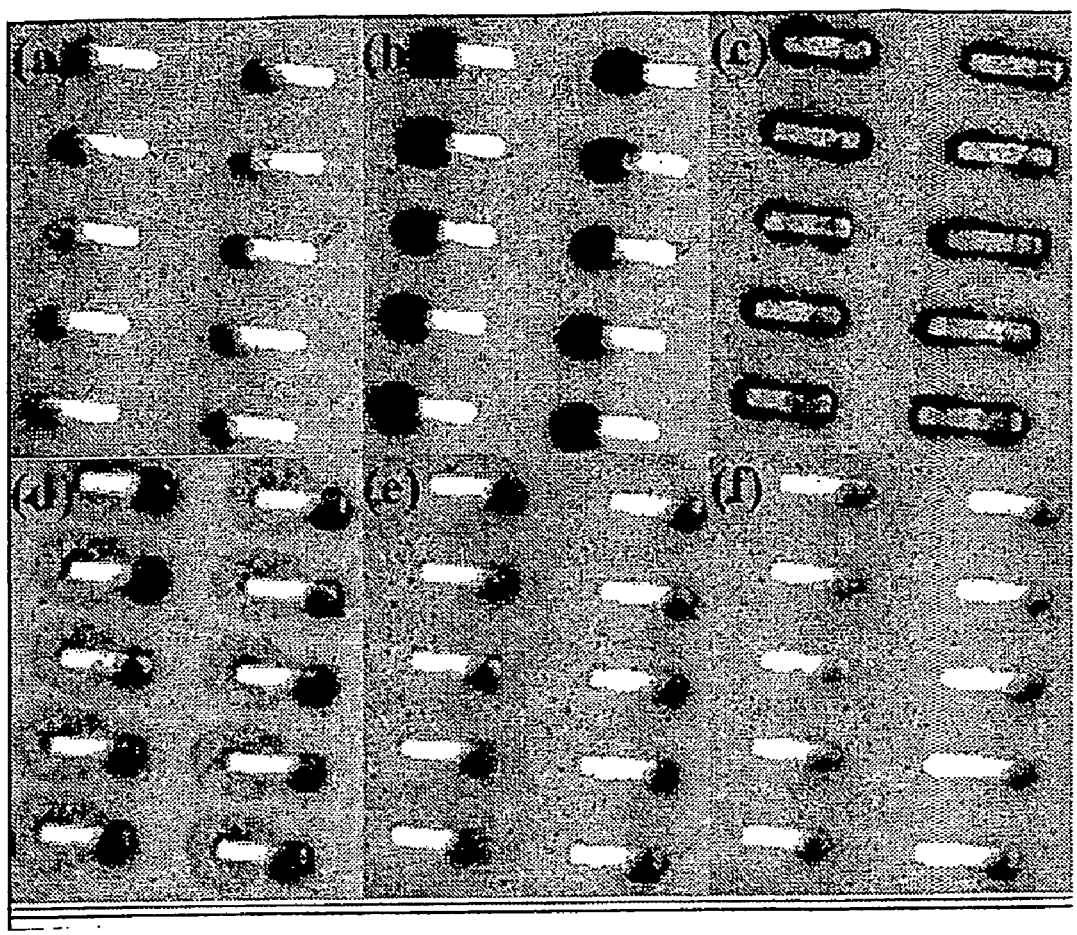
FIGS. 4(a) through 4(f) is a sequence of images depicting the attraction of ferrofluid to one or the other end of a ferromagnetic bit by application of external magnetic fields as shown in FIGS. 1(a) and 1(b). The attraction of the ferrofluid to one end is dependent on the magnetic fields applied. When the magnetic fields are reversed, the ferrofluid is repelled from the first end and attracted to the opposite end as shown in FIG. 4(d) through 4(f).
Figure 5:
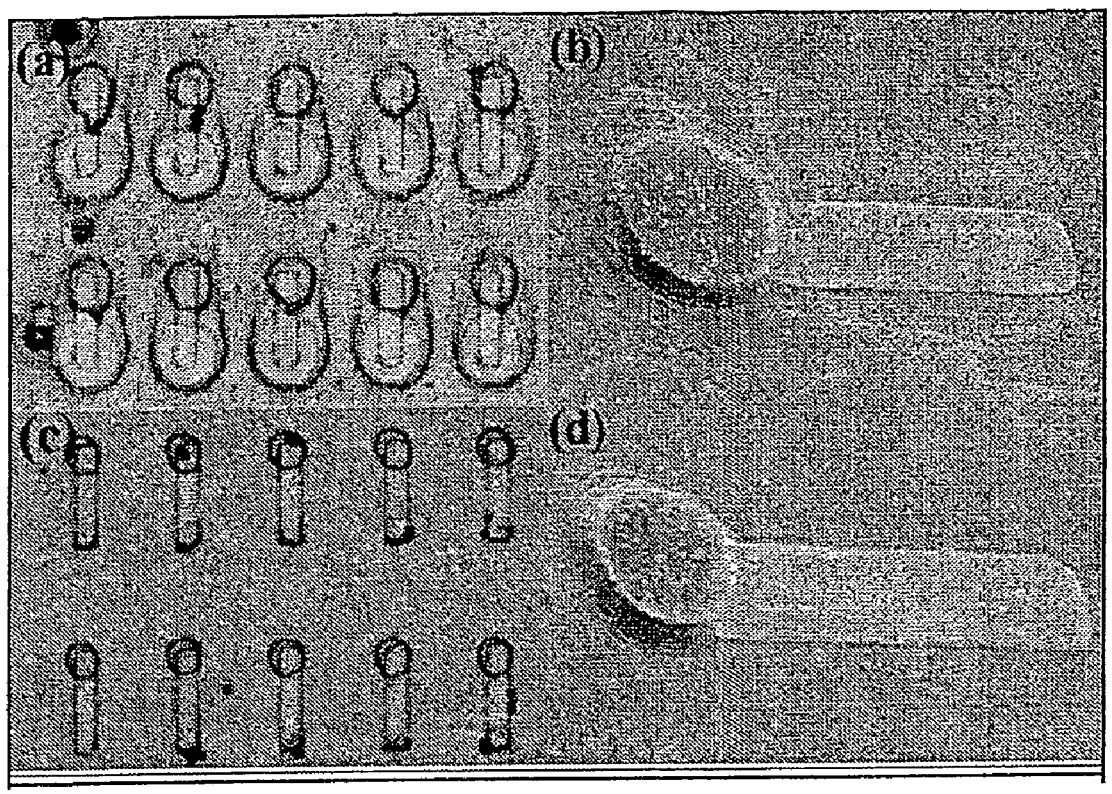
FIGS. 5(a) through 5(d) are optical and SEM (Scanning Electron Microscope) images of positive Shipley 1813 photosensitive film patterns after masking, exposure to ultraviolet radiation and development.
Figure 6:
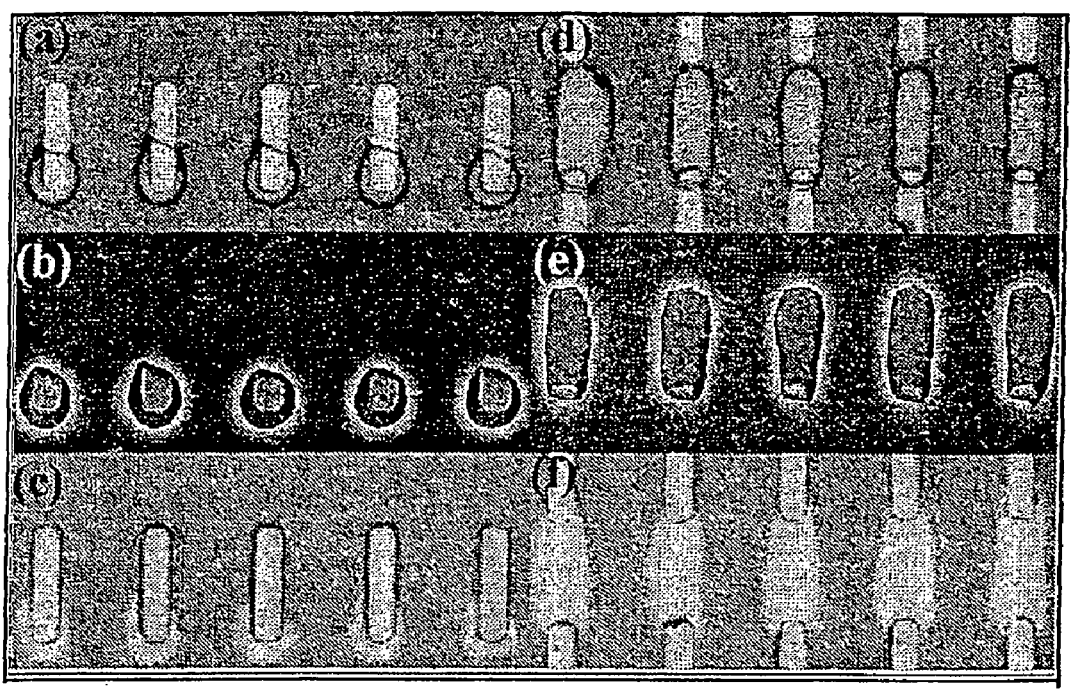
FIGS. 6(a) through 6(f) are optical and SEM images of negative NR-7 photosensitive film patterns after masking and exposure to ultraviolet radiation.

Results from experiments wherein ferrofluid masks were used in accordance with the present invention are shown in FIGS. 4, 5 and 6. FIGS. 4(a) through 4(f) show a sequence of images depicting the attraction of ferrofluid to one or the other end of a magnetic bit by application of external magnetic fields as shown in FIGS. 1(a) and 1(b). The attraction of the ferrofluid to one end is dependent on the magnetic fields applied. When the magnetic fields are reversed, the ferrofluid is repelled from the first end and attracted to the opposite end as shown in FIG. 4(d) through 4(f).

FIGS. 5(a) through 5(d) are optical and SEM images of positive Shipley 1813 photosensitive film patterns after masking and exposure to ultraviolet radiation.

FIGS. 6(a) through 6(f) are optical and SEM images of negative NR-7 photosensitive film patterns after masking and exposure to ultraviolet radiation. FIGS. 6(a) and 6(b) are the masking patterns formed by magnetic fields applied to the substrate as shown in FIG. 1(a), while FIGS. 6(d) and 6(e) are the masking patterns formed by magnetic fields applied to the substrate as shown in FIG. 1(d). The negative NR-7 photosensitive film is specifically formulated for lift-off. After evaporation of gold metal on top of the photosensitive patterned film and then stripping of the photosensitive film, a gold pattern is formed aligned with respect to the magnetic bits. See FIGS. 6(c) and 6(f).

Fabricating multi-component patterns using a suspension of magnetic nanoparticles in accordance with the present invention relies on the ability to record the magnetization of selected areas of the recordable magnetic substrate in an "on" or "off" state. One method for creating the "on" and "off" sites is to place a set of magnetic pins near chosen sites of a surface. The positions closest to the pins are the regions of magnetic field maxima, corresponding to the "on" state. In the "on" state, the presence of magnetic nanoparticles prevents exposure of the substrate to ultraviolet radiation, or chemicals, or binding of a molecule to the substrate to take place, while in other areas of the substrate in the "off" state, the absence of the magnetic nanoparticle coating allows such exposure or binding or any substrate modifying process to take place. In another method, the "on" and "off" sites are produced by materials embedded in the surface. These materials can be designed with ferromagnetic properties containing bistable states that can be programmed by existing thermomagnetic recording methods. Here, application of an external uniform magnetic field can promote some regions of the ferromagnetic material to contain the magnetic field maxima, and other regions of the material to contain the magnetic field minima. The mask will accumulate on the magnetic field maxima, corresponding to the "on" state, while avoiding the magnetic field minima, corresponding to the "off" state. The regions of magnetic field minima and maxima can be shifted by re-programming the ferromagnetic material in a different direction. The re-programming process of addressable ferromagnetic bits can be accomplished using thermomagnetic recording methods, wherein low strength magnetizing fields are applied across large portions of the substrate while a focused laser beam heats selected areas. The increase in temperature reduces the coercive switching fields of heated portions versus unheated portions of the substrate, thus allowing only the ferromagnetic bits in the heated portions of the substrate to have their magnetization switched in the presence of the magnetizing fields.

A heterogeneous pattern of multiple components can be created using a series of steps wherein a first set of regions of a substrate is turned on to allow accumulation of a magnetic nanoparticle mask. A physical or chemical etchant or chemical reagent or reagents, or ultraviolet radiation or another form of radiation, or electron, ion or neutron beam, or other surface modifying process is introduced into the system in order to modify the unmasked sites. Some examples of chemically reactive agents are DNA fragments and proteins that react with surface groups through covalent or ionic interactions. This is followed by quenching of the reaction and rinsing of the excess reagent, if necessary. Additional examples of modifying substances include, but are not limited to, electrochemical reactions intended to deposit or remove material to or from the unmasked regions of the substrate, deposition or removal of material by evaporation, and deposition or removal of material by ion beam, electron beam, neutron beam or other similar means to or from unmasked regions of the substrate. The surface is then re-programmed to accept different surface modifications at newly recorded locations. For applications employing magnets embedded in this substrate, this re-magnetizing of the surface includes turning off select areas that were turned on in the previous step, as well as turning on a new set of select areas to be modified in the next step. By repeating this procedure for each type of component, a heterogeneous pattern can be built up step by step in a complete, self-aligned manner.

After masking, the magnetic nanoparticles can be re-suspended by simply reversing or removing the applied magnetic field bias. The magnetic nanoparticles can also be easily washed away. Spatial programming of the mask in each step can be accomplished by recording the magnetization direction of the individual magnetic bits, and thus the positions of the desired locations to be masked.

Patterning by magnetic nanoparticle masking in accordance with the present invention provides significant advantages over other masking techniques. For example, one advantage is that magnetic nanoparticles of the suspension automatically align with the regions of magnetic field maxima on the substrate surface. When the external magnets are embedded directly in the substrate, an inherent self-alignment feature eliminates the need for manual alignment of the mask after each step, as is required in photolithographic patterning. Using a recordable magnetic pattern and selected areas thereof, resolution of 50 nm or better is expected. Traditional photolithographic techniques, by contrast, have difficulty in aligning multiple patterns with micrometer resolution. Another advantage is that the suspension of magnetic nanoparticles has been shown to perform consistent masking even through barriers of micrometer thickness. The accumulation of magnetic nanoparticle masks at long range indicates that masking can also be accomplished with magnetic bits that are embedded substantially inside the substrate or even held externally to a thin substrate. Embedded magnetic bits allow patterning to be performed on a surface that has uniform surface chemistry, which is essential for applications in combinatorial chemistry, genomic analysis, and drug discovery. In addition, the magnetic nanoparticle mask can be dissolved by simply turning off or reversing the external magnetic field bias. Therefore, no harmful chemical solvents need to be employed to remove the masking layer. Thus, the magnetic nanoparticle liquid masks are far more convenient than photolithographic patterning techniques which use a solid photoresist mask that has to be dissolved with harsh chemical solvents after each step. Accordingly, magnetic nanoparticle masks provide a fast, inexpensive, and gentle route to creating heterogeneous nanopatterns.

The method of the present invention can be used in various lithographic applications including, but not limited to, optical masking, diffusion masking, physical or chemical etch masking, masking against sputtering or evaporation of material onto a surface, and masking against electron, neutron or ion beam implantation. This fabrication method is especially suited to applications in genomic analysis, cell patterning, and drug discovery, where many different molecules (often greater than 100 types of molecules) need to be patterned on a surface with high resolution. The advantage of self-aligned patterning is demonstrated more clearly as the number of components in the pattern increases. In addition, magnetic nanoparticle masks are uniquely capable of assembling heterogeneous biological systems, as many different biological materials can be assembled inside magnetic nanoparticle fluids without altering, damaging or destroying previously deposited materials with the harsh chemicals used in traditional masking techniques.

The efficacy of this masking was demonstrated using Cobalt films. Recordable magnetic patterns were made in evaporated Cobalt film 100-nm in thickness by conventional photolithographic lift-off methods. The magnetic patterns used in these experiments were 4-microns wide and 20-microns long. Following patterning, the substrate was submersed in a bath of deionized water and an aqueous solution of domain-detection ferrofluid (purchased from Ferrotec, Inc., NH, USA) was injected into the bath under the influence of applied magnetic fields.

The programmability of this process was demonstrated by alternating the magnetic field bias, thereby causing the ferrofluid that accumulated at one pole to switch to the opposite pole in a matter of seconds. Images taken from video footage confirm this switching behavior of ferrofluid in the presence of an oscillating external magnetic field bias. In these experiments, the ferrofluid initially coated the left end of the magnetic bits, because of external magnetic fields that bias the ferrofluid to be attracted to one pole. However, the ferrofluid switched to the opposite pole when the magnetic field bias was reversed. Previously restricted locations were unmasked so that molecular monolayers are permitted to assemble at or chemicals are permitted to react with those unmasked locations. Complete switching of the ferrofluid from one side to the other was accomplished in under a few seconds. This switching phenomenon can thus be used to create heterogeneous molecular patterns. Further, various patterns can formed on the substrate depending upon the field orientation. The thickness of the ferrofluid layer, measured by AFM, was observed to be micrometers thick in certain locations.

The ability of ferrofluid to act as an optical mask was demonstrated using positive Shipley 1813 photoresist and negative NR-7 photoresist spun onto a wafer containing a pattern of Cobalt magnetic bits. A drop of ferrofluid was dispensed onto the wafer and a cover glass slide was placed on top of the ferrofluid in order to promote the formation of an optically transparent ferrofluid film. When external magnetic fields were applied, the ferrofluid accumulated over one pole of the magnetic bit while avoiding the other pole. The optical contrast between the two poles was used as a photolithographic mask against flood exposure by ultraviolet radiation. In particular, the wafer with ferrofluid mask was exposed to I-line ultraviolet radiation (365 nm). In these experiments, the bake times, spin speeds, and other processing parameters were kept constant. Masking conditions were varied by adjusting the ferrofluid concentration and ultraviolet exposure time.

SEM analysis of a typical photoresist spot-over the poles averaged approximately 8-pm in diameter with great uniformity among spots across the wafer. The slope of the photoresist side-walls was approximately 45° as measured by AFM.

In addition to the above experiments, the process of ferrofluid assembly onto magnetized film has also been studied theoretically to determine if ferrofluid can form a stable blockage and prevent the diffusion of other molecules onto the surface of the magnetic bit.

In stabilized magnetic colloids, where spontaneous magnetization does not occur in the absence of a magnetic field, equilibrium regions of particle aggregation are the result of competition between diffusion and magnetic forces. In many previous models in the literature, magnetic forces on particles were calculated using the assumption that the non-magnetic carrier fluid is incapable of screening external magnetic fields. This assumption is valid only in the regions of relatively low particle concentrations. Moreover, previous models of high gradient magnetic separation schemes (HGMS) ignored possible perturbation of the external magnetic fields by the spatially varying concentrations of the magnetic particles in the fluid. Volume susceptibility of the fluid at higher magnetic particle concentrations can be as high as 10. Thus, neglecting the demagnetizing field due to the spatially varying concentration is justified only at lower concentrations far away from any magnetic wires or magnetic poles placed in the fluid. The self-consistent model presented below takes into account both the magnetic field screening by the fluid and the demagnetizing field due to spatially varying particle concentration.

Volume magnetization, $M_p$, of a particle is dependent on external magnetic field H (which is assumed to be uniform inside the particle). For relatively weak magnetic fields, the relationship between the magnetization and magnetic field is linear and in the vector form can be written as follows:

$$\vec{M}_p = \chi \vec{H}, \vec{m}_p = V_p \vec{M}_{p,x} = \frac{\mu_o V_p M_s^2}{3 k_B T} \quad (1)$$

where $m_p$ is the magnetic moment of a particle of volume, $V_p$, $M_s$ is saturation magnetization of particles, $k_B$ is Boltzmann constant, and T is the absolute temperature.

The force acting on a particle inside magnetic fluid takes the form:

$$\vec{F}_m = \mu_0 (\vec{m}_p - \langle \vec{m} \rangle) \cdot \nabla \vec{H} \quad (2)$$

where $\langle \vec{m} \rangle$ represents an average magnetic moment of unit volume of magnetic fluid surrounding the particle. It is assumed that $\langle \vec{m} \rangle$ at a given point in space is related to $m_p$ by:

$$\langle \vec{m} \rangle = \vec{m}_p C(\vec{r}) \quad (3)$$

where $C(\vec{r})$ is the volume concentration of particles (fraction of volume occupied by the particle material). The balance of force $\vec{F}_m$ on the magnetic particle and the fluid drag determines the velocity of the particle (Stoke's law)

$$\vec{v}_p = \eta \vec{F}_m = \eta \mu_0 (\vec{m}_p - \langle \vec{m} \rangle) \cdot \nabla \vec{H} \quad (4)$$

where the coefficient of proportionality $\eta$ is the mobility of the particle, which characterizes the fluid drag. The effects of magnetic field screening due to the fluid magnetization are taken into account in (2) and (4) by subtracting the average fluid magnetization. This is one of the main differences with respect to previous models employed in HGMS.

The total flux of particles is the sum of two components, a diffusion component $$\vec{J}_{diff} = -D \nabla C(\vec{r}) \quad (5)$$

and a drift component $$\vec{J}_{drift} = C(\vec{r}) \vec{v}_p \quad (6)$$

Under static equilibrium conditions the total flux of particles must be zero, $$\vec{J} = \vec{J}_{diff} + \vec{J}_{drift} = 0 \quad (7)$$

Using (3-7) one obtains $$\nabla C(\vec{r}) = (k_B T)^{-1} C(\vec{r})(1 - C(\vec{r})) \mu_0 \vec{m}_p \cdot \nabla \vec{H} \quad (8)$$

where, from the Einstein relation, $(k_B T)^{-1} = \eta/D$, and C is the unknown concentration of magnetic particles. Substituting $m_p$ defined in (1), equation (8) can be directly re-arranged as follows:

$$\frac{\nabla C(\vec{r})}{C(\vec{r})(1-C(\vec{r}))} = \nabla \ln \frac{C}{1-C} = \nabla \frac{\mu_o \chi V_p H^2}{2k_B T} \quad (9a)$$

Given that the bulk of the fluid is in zero field (far away from any field sources) and has bulk particle concentration $C_i$, equation 9(a) can be integrated to yield:

$$\frac{C(\vec{r})}{(1-C(\vec{r}))} = \frac{C_i}{(1-C_i)} \exp\left(\frac{\mu_o \chi V_p H^2}{2k_B T}\right) = A \exp\left(\frac{\alpha^2}{6}\right) \quad (9b)$$

wherein the constant A and function $$\alpha(\vec{r}) = \frac{\mu_o V_p M_s}{k_B T} H(\vec{r}),$$

are dimensionless quantities defined for the sake of convenience. Expression for concentration can be obtained from (9b) by simple algebraic manipulation:

$$C(\vec{r}) = \frac{1}{1 + A^{-1} \exp\left(\frac{-\alpha^2}{6}\right)}, \quad (10)$$

It is important to note that the dimensionless function α can be interpreted as the ratio of two energies: particle's potential energy in the external magnetic field and its thermal fluctuation energy. From this, it is clear that spatial variation of concentration in (10) is completely consistent with equilibrium statistical mechanics. In fact, the right hand side of (10) can be recognized as the Fermi-Dirac function. It emerges as a result of field screening by magnetic particles in the solution, which reduces the magnetic force to zero at 100% concentration. In the presence of diffusion this does not allow particles to overlap. The impossibility of particle overlap leads to Fermi-Dirac distribution in much the same way as it happens due to the exclusion principle in quantum mechanics. Therefore, concentration saturation emerges naturally in this model without the need to use artificially set hard concentration limits often imposed in HGMS models that do not take field screening into account.

In determining average magnetization of the fluid, effects of particle interactions were neglected above. Mean spherical model takes into account interactions between the particles by introducing a correction to the noninteracting particle model discussed above, which can be written in the linear regime of weak magnetic field as:

$$<\vec{m}> = (1+\alpha C(\vec{r}))C(\vec{r})\vec{m}_p = (1+\alpha C(\vec{r}))C(\vec{r})V_p \chi \vec{H} \quad (11)$$

where $\chi$ is zero-field susceptibility defined through (1), and parameter a typically has a value around 3, making the effects of concentration important when the concentration is greater than roughly 20-30%.

Using equation (4-7) and (11) and following the line of reasoning used to derive (9a), the following is derived:

$$\frac{\nabla C}{C(1-C)(1+aC)} = \nabla\left(\frac{\mu_o V_p \chi H^2}{2k_B T}\right) = \nabla \frac{\alpha^2}{6} \quad (12)$$

Just like (9a), the above equation can be integrated to yield:

$$\frac{C(\vec{r})}{(1-C(\vec{r}))^{\frac{1}{1+a}}(1+aC(\vec{r}))^{\frac{a}{1+a}}} = A_{MS} \exp\left(\frac{\mu_o V_p \chi H^2}{2k_B T}\right) = A_{MS} \exp\left(\frac{\alpha^2}{6}\right) \quad (13)$$

where the function α is defined as in (9b) and $$A_{MS} = \frac{C_i}{(1-C_i)^{\frac{1}{1+a}}(1+aC_1)^{\frac{a}{1+a}}}$$

is the integration constant evaluated as before by setting the field equal to zero and using the bulk fluid value of the concentration $C_i$.

The following nonlimiting example is provided to further illustrate the present invention.

EXAMPLES

Example 1

Materials and Methods

Experiments were performed using Silicon or Pyrex substrates patterned with 100 nm thick Cobalt bits by conventional photolithographic lift-off process In the lift-off process, an image is defined by exposing photoresist to ultraviolet radiation through a patterned optical mask. The photoresist pattern is developed, and then Cobalt is evaporated onto the patterned wafer. Finally, the remaining photoresist is stripped to produce a pattern of Cobalt film. While negative or multi-layer resists are frequently utilized to obtain an undercut resist profile, positive Shipley 1813 photoresist yielded satisfactory results. Individual bits in these experiments have a planar dimension of 4 pm by 20 pm. Aqueous based ferrofluid domain detection fluid purchased from Ferrotec was applied to the substrate in varying concentrations to determine optimal masking conditions. The resulting ferrofluid masks were observed in a fluidic bath using a Leica DM LFS microscope with fluid-immersion lens. Ferrofluid masks were also observed as a thin coating of the substrate formed by placing a cover glass slide on top of a drop of ferrofluid.

What is claimed is:
1. A method for fabricating a multi-component pattern comprising:
   (a) defining a first set of regions of localized magnetic field maxima and minima on a substrate;
   (b) applying magnetic nanoparticles to the substrate so that the magnetic nanoparticles aggregate on the first set of regions of localized magnetic field maxima and avoid regions of localized magnetic field minima;
   (c) exposing the substrate to a substrate modifying process to modify sites of the substrate without aggregated magnetic nanoparticles
   (d) defining a second set of regions of localized magnetic field maxima and minima on the substrate;

(e) applying magnetic nanoparticles to the substrate so that the magnetic nanoparticles aggregate on the second set of regions of localized magnetic field maxima and avoid regions of localized magnetic field minima;

(f) exposing the substrate to a second substrate modifying process to modify sites of the substrate without aggregated magnetic nanoparticles; and (g) repeating steps (a) through (f) with additional substrate modifying processes.

2. A method for fabricating a multi-component pattern comprising:

(a) defining a first set of regions of localized magnetic field maxima and minima on a substrate; and (b) applying magnetic nanoparticles to the substrate so that the magnetic nanoparticles aggregate on the first set of regions of localized magnetic field maxima and avoid regions of localized magnetic field minima.

3. The method of claim 2, further comprising:

(c) exposing the substrate to a substrate modifying process to modify sites of the substrate without aggregated magnetic nanoparticles.

4. The method of claim 3, further comprising:

(d) defining a second set of regions of localized magnetic field maxima and minima on the substrate;

(e) applying magnetic nanoparticles to the substrate so that the magnetic nanoparticles aggregate on the second set of regions of localized magnetic field maxima and avoid regions of localized magnetic field minima; and (f) exposing the substrate to a second substrate modifying process to modify sites of the substrate without aggregated magnetic nanoparticles.

5. The method of claim 4, further comprising:

(g) repeating steps (d) through (f) with additional substrate modifying processes.

* * * * *